(12) United States Patent
Ponton et al.

(10) Patent No.: US 9,819,356 B2
(45) Date of Patent: Nov. 14, 2017

(54) INJECTION LOCKED RING OSCILLATOR BASED DIGITAL-TO-TIME CONVERTER AND METHOD FOR PROVIDING A FILTERED INTERPOLATED PHASE SIGNAL

(71) Applicant: Intel IP Corporation, Santa Clara, CA (US)

(72) Inventors: Davide Ponton, Villach (AT); Antonio Passamani, Villach (AT); Andrea Bevilacqua, Padua (IT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/570,299

(22) Filed: Dec. 15, 2014

(65) Prior Publication Data

US 2016/0173119 A1   Jun. 16, 2016

(51) Int. Cl.
| | |
|---|---|
| H03M 1/66 | (2006.01) |
| H04L 27/233 | (2006.01) |
| H03C 3/00 | (2006.01) |
| H03M 1/82 | (2006.01) |
| H03K 3/03 | (2006.01) |
| G04F 10/00 | (2006.01) |
| H03L 7/099 | (2006.01) |
| H03K 5/131 | (2014.01) |

(52) U.S. Cl.
CPC ............. *H03M 1/662* (2013.01); *H03C 3/00* (2013.01); *H03M 1/82* (2013.01); *H04L 27/2331* (2013.01); *G04F 10/005* (2013.01); *H03K 3/0315* (2013.01); *H03K 5/131* (2013.01); *H03L 7/0998* (2013.01)

(58) Field of Classification Search
CPC ........ H04L 7/033; G04F 10/005; H03M 1/82; H03K 3/0315; H03L 7/0998
See application file for complete search history.

(56) References Cited

U.S. PATENT DOCUMENTS

| | | | |
|---|---|---|---|
| 4,742,331 A | 5/1988 | Barrow et al. | |
| 7,545,232 B2 | 6/2009 | Boos et al. | |
| 8,390,349 B1 | 3/2013 | Ravi et al. | |

(Continued)

FOREIGN PATENT DOCUMENTS

| | | |
|---|---|---|
| CN | 105703766 A | 6/2016 |
| TW | 201631899 A | 9/2016 |

OTHER PUBLICATIONS

"European Application Serial No. 15194395.8, Extended European Search Report dated Jun. 6, 2016", 10 pgs.

(Continued)

*Primary Examiner* — Ross Varndell
(74) *Attorney, Agent, or Firm* — Schwegman Lundberg & Woessner, P.A.

(57) ABSTRACT

Apparatus and methods for a digital-to-time converter (DTC) are provided. In an example, a DTC can include a phase interpolator and a ring oscillator. The phase interpolator can be configured to receive digital representations of two or more distinct phase signals, and to interpolate the digital representations of the two or more distinct phase signals to provide an interpolated output phase signal. The ring oscillator can be configured to receive the interpolated phase signal, to lock on to a frequency and a phase of the interpolated output phase signal, and to provide a filtered phase signal.

20 Claims, 6 Drawing Sheets

(56) References Cited

U.S. PATENT DOCUMENTS

| | | | |
|---|---|---|---|
| 8,989,329 B2* | 3/2015 | Hammad | H04L 7/0079 375/224 |
| 2006/0055473 A1 | 3/2006 | Takayama | |
| 2010/0091688 A1* | 4/2010 | Staszewski | H03D 7/1441 370/277 |
| 2010/0109714 A1* | 5/2010 | Lindfors | G06F 1/022 327/105 |
| 2014/0072077 A1* | 3/2014 | Cheng | H04L 27/20 375/303 |
| 2014/0266822 A1 | 9/2014 | Henzler et al. | |
| 2014/0321515 A1 | 10/2014 | Ponton | |
| 2015/0222287 A1* | 8/2015 | Tekin | H03M 1/0836 375/355 |

OTHER PUBLICATIONS

"European Application Serial No. 15194395.8, Response filed Jan. 6, 2017 to Extended European Search Report dated Jun. 6, 2016".

"Taiwanese Application Serial No. 104137179, Office Action dated Oct. 5, 2016", W/ English Translation, 15 pgs.

"Taiwanese Application Serial No. 104137179, Office Action dated Dec. 27, 2016", W/ English Translation, 10 pgs.

"Taiwanese Application Serial No. 104137179, Response filed Dec. 15, 2016 to Office Action dated Oct. 5, 2016", W/ English Claims, 10 pgs.

Dally, W J, et al., "A second-order semi digital clock recovery circuit based on injection locking", , IEEE Journal of Solid-State Circuits, IEEE Service Center, Piscataway, NJ, USA, vol. 38, No. 12, XP011104260,, (Dec. 1, 2003), 2101-2110.

Lee, Sang Yeop, et al., "A Novel Direct Injection-Locked QPSK Modulator Based on Ring VCO in 180 nm CMO", IEEE Microwave and Wireless Components Letters, IEEE Service Center, New York,NY, US, vol. 24, No. 4, XP011544651, (Apr. 1, 2014).

Young-Ju, Kim, et al., "A 7.4 Gb/s forwarded clock receiver based on first-harmonic injection-locked oscillator using AC coupled clock multiplication unit in 0.13A[mu]m CMOS", Custom Integrated Circuits Conference (CICC), 2011 IEEE, IEEE XP032063812, (Sep. 19, 2011), 1-4.

"Taiwanese Application Serial No. 104137179, Response filed Mar. 6, 2017 to Office Action dated Dec. 27, 2016", w/English Claims, 11 pgs.

* cited by examiner

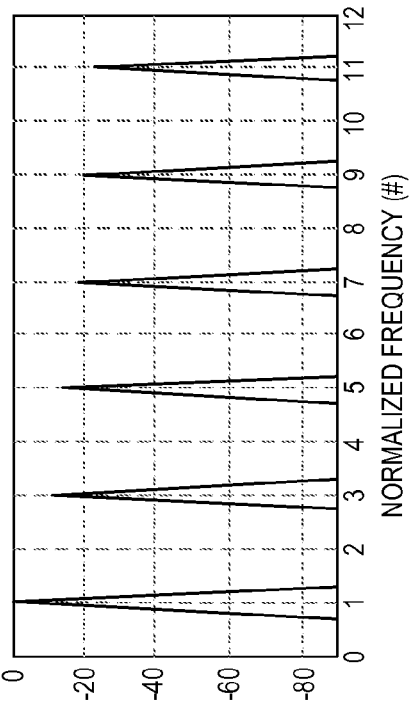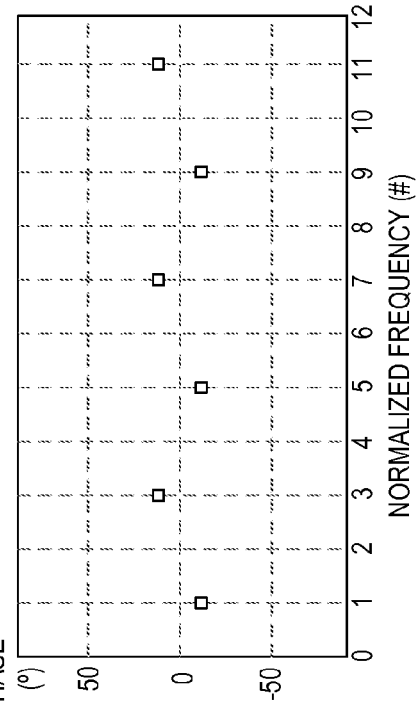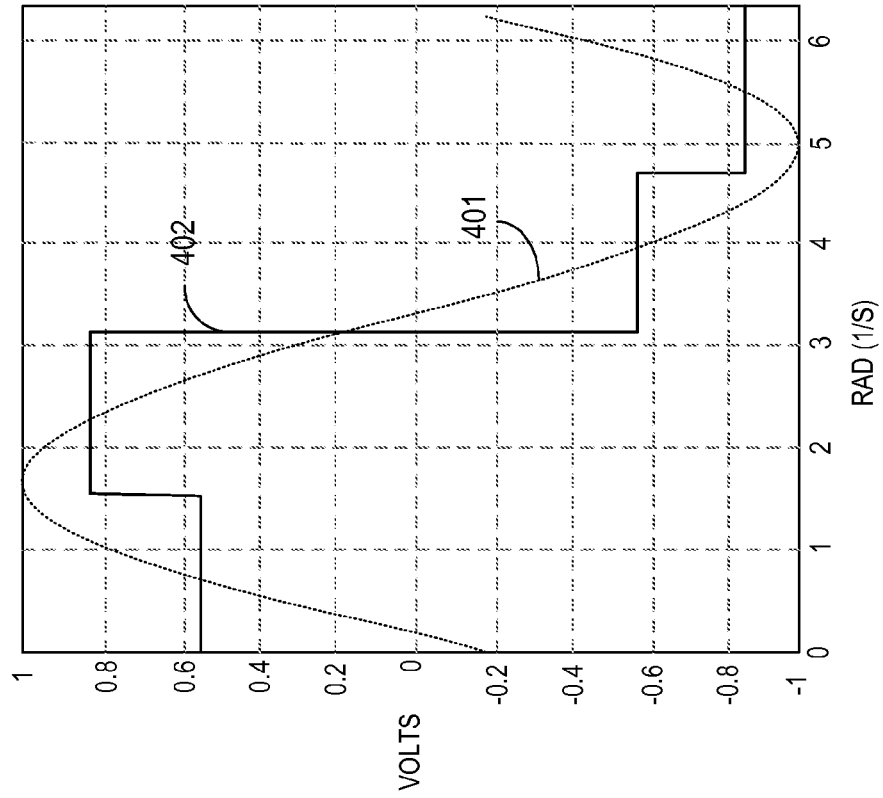
FIG. 4B
FIG. 4C
FIG. 4A

INJECTION LOCKED RING OSCILLATOR BASED DIGITAL-TO-TIME CONVERTER AND METHOD FOR PROVIDING A FILTERED INTERPOLATED PHASE SIGNAL

TECHNICAL FIELD

The present subject matter generally relates to communication architectures including digital polar transmitters (DPTX) architectures and, in particular, to apparatus and methods for interpolating a phase modulated signal. Some embodiments relate to transceivers including transceivers suitable for use in, for example, Bluetooth networks, Wifi Networks, 3GPP LTE networks, 4G networks and future generation networks.

BACKGROUND

Digital polar transmitter (DPTX) architectures are very attractive for modern radios because they can provide improved area and power consumption characteristics compared with conventional analog architectures. Digital-to-time converters (DTCs) can be used to generate frequency or phase modulated signals in digital polar transmitters. Existing DTCs are built with a chain of inverters, made of a coarse resolution chain and some interpolating structures for fine resolution. As such, DTCs can suffer from two main issues. First, the delay generated by the coarse resolution can strongly depend on Process-Voltage-Temperature (PVT) variations, which can hardly be corrected by calibration. Second, poor spectral purity of the generated clock can result from thermal noise and flicker noise generated by inverters in the chain.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4A, 4B and 4C illustrate performance characteristics associated with the DTC structure illustrated in FIG. 3.

DETAILED DESCRIPTION

As discussed briefly above, digital polar transmitter (DPTX) architectures are very attractive for modern radios because they can provide greatly improved area and power consumption characteristics compared with conventional analog architectures. For low baseband bandwidths (e.g., for Global System for Mobile Communications (GSM)and Universal Mobile Telecommunications System (UMTS) standards), modulation can be achieved by directly modulating a phase-locked loop or phase lock loop (PLL) signal. For modern standards such as LTE, the signal bandwidth is increased to 40 MHz and beyond (e.g., by carrier aggregation), making direct PLL modulation ineffective. For higher bandwidth applications, DTCs can be used to for phase/frequency modulation within a polar transmitter and for frequency generation in a polar receiver.

Figure 1:
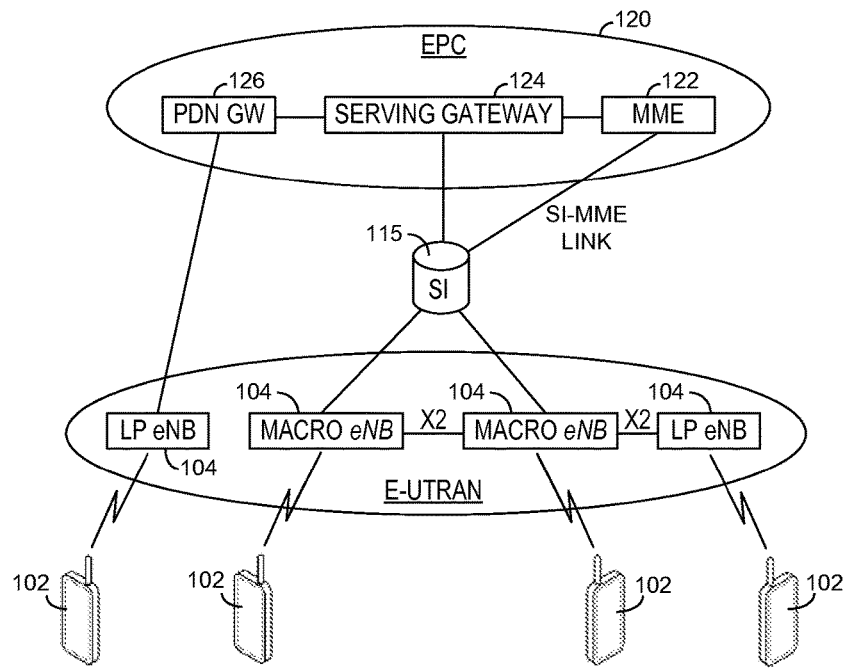
FIG. 1 shows a portion of an end-to-end network architecture of LTE (long term evolution) network with various components of the network in accordance with some embodiments.

FIG. 1 shows a portion of an end-to-end network architecture of LTE (long term evolution) network with various components of the network in accordance with some embodiments. The network comprises a radio access network (RAN) (e.g., as depicted or an evolved universal terrestrial radio access network (E-UTRAN)) and the core network (EPC) 120 coupled together through an S1 interface 115. Note that for the sake of convenience and brevity, only a portion of the core network, as well as the RAN, is shown.

The EPC 120 includes a mobility management entity (MME) 122, serving gateway (serving GW) 124, and packet data network gateway (PDN GW) 126. The RAN includes enhanced node Bs (eNBs) 104 (which may operate as base stations) for communicating with user equipment (UE) 102. The eNBs 104 may include macro eNBs and low power (LP) eNBs.

The MME 122 is similar in function to the control plane of legacy Serving GPRS Support Nodes (SGSN). It manages mobility aspects in access such as gateway selection and tracking area list management. The serving GW 124 terminates the interface toward the RAN, and routes data packets between the RAN and core network. In addition, the serving GW 124 may be a local mobility anchor point for inter-eNB handovers and also may provide an anchor for inter-3GPP mobility. Other responsibilities may include lawful intercept, charging, and some policy enforcement. The serving GW 124 and the MME 122 may be implemented in one physical node or separate physical nodes. The PDN GW 126 terminates a SGi interface toward the packet data network (PDN). It routes data packets between the EPC 120 and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW 126 and the serving GW 124 may be implemented in one physical node or separated physical nodes.

The eNB 104 (macro and micro) terminates the air interface protocol and is usually (if not always) the first point of contact for a UE 102. In some embodiments, an eNB 104 may fulfill various logical functions for the RAN including but not limited to RNC (radio network controller functions) such as radio bearer management, uplink and downlink dynamic radio resource management and data packet scheduling, and mobility management.

The S1 interface 115 is the interface that separates the RAN and the EPC 120. It is split into two parts: the S1-U, which carries traffic data between the eNB 104 and the serving GW 124, and the S1-MME, which is a signaling interface between the eNB 104 and the MME 122. The X2 interface is the interface between eNBs 104 (at least between most, as will be addressed below regarding micro eNBs).

The X2 interface comprises two parts: the X2-C and X2-U. The X2-C is the control plane interface between eNBs 104, while the X2-U is the user plane interface between eNBs 104.

With cellular networks, LP cells are typically used to extend coverage to indoor areas where outdoor signals do not reach well, or to add network capacity in areas with very dense phone usage, such as train stations. As used herein, the term "low power (LP) eNB" refers to any suitable relatively low power eNode-B for implementing a narrower cell (narrower than a macro cell) such as a femtocell, a picocell, or a micro cell. Femtocell eNBs are typically provided by a mobile network operator to its residential or enterprise customers. A femtocell is typically the size of a residential gateway or smaller and generally connects to the user's broadband line. Once plugged in, the femtocell connects to the mobile operator's mobile network and provides extra coverage in a range of typically 30 to 50 meters for residential femtocells. Thus, a LP eNB might be a femtocell eNB since it is coupled through the PDN GW 126. Similarly, a picocell is a wireless communication system typically covering a small area, such as in-building (offices, shopping malls, train stations, etc.), or more recently in-aircraft. A picocell eNB can generally connect through the X2 link to another eNB such as a macro eNB through its base station controller (BSC) functionality. Thus, LP eNB 104 could be implemented with a picocell eNB since it is coupled to a macro eNB via an X2 interface. Picocell eNBs (or other LP eNBs for that matter) may incorporate some or all functionality of a macro eNB. In some cases, this may be referred to as an access point base station or enterprise femtocell.

Digital polar transmitter (DPTX) architectures are very attractive for modern radios because such architectures can provide improved area and power consumption characteristics compared with conventional analog architectures. In accordance with some embodiments, a UE 102 or an eNB 104 may include a DPTX, which may include a digital-to-time converter (DTC). In these embodiments, the DTC may include a phase interpolator configured to receive and interpolate digital representations of two or more distinct phase signals to provide an interpolated output phase signal. In certain examples, the DTC can a ring oscillator configured to receive the interpolated phase signal, to lock on to a frequency and a phase of the interpolated output phase signal, and to provide a filtered phase signal.

Figure 2:
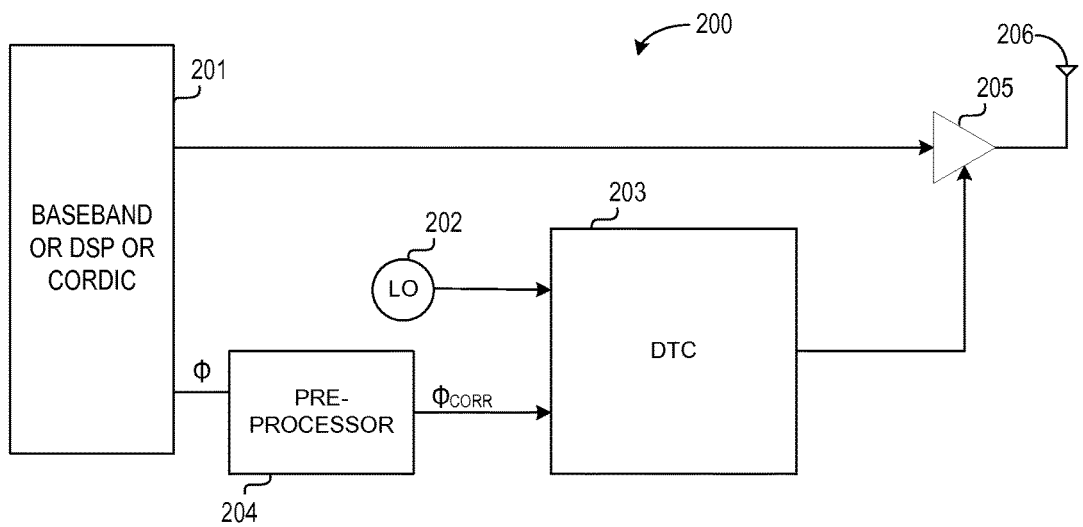
FIG. 2 illustrates generally a digital polar transmitter according to embodiments of the present subject matter.

FIG. 2 illustrates generally a digital polar transmitter 200 according to an embodiment of the present subject matter. The illustrated architecture is shown for an example transmitter radio circuit. It is understood that polar architectures can also be employed in receiver radio circuits or in combination transceiver circuits including both a transmitter and a receiver. In certain examples, the transmitter 200 can include a processor 201, a local oscillator 202, a DTC 203, an optional preprocessor 204 for the DTC 203, a power amplifier 205, and an antenna 206. In certain examples, the processor 201 can include a baseband processor such as for a mobile electronic device, a digital signal processor (DSP) or a Cordic converter for providing amplitude and phase modulation information representative of digital transmission data. In certain examples, some known non-linearity of the DTC 203 can be compensated for using the preprocessor 204. In some examples, the preprocessor 204 can receive phase modulation information from the processor 201. In some examples the preprocessor 204 can receive phase ramp information ($\Psi$) for providing a desired radio frequency. In certain examples, the preprocessor 204 can adjust or correct the received processor information to provide corrected information ($\Psi_{CORR}$) to compensate for at least some of the non-linearity of the DTC 203. In certain examples, the DTC 203 can receive reference clock information from the local oscillator 202 and the corrected processor information ($\Psi_{CORR}$) from the preprocessor 204. The DTC 203 can provide an output signal ($DTC_{OUT}$) at a desired frequency using the local oscillator 202 and the corrected processor information ($\Psi_{CORR}$). For transmitter examples, the power amplifier 205 can mix the output signal ($DTC_{OUT}$) with amplitude information to provide a transmission signal. The antenna 206 can broadcast the transmission signal for reception by a second device. In certain receiver examples, a DTC can be used to modulate reference frequency and phase information to provide a suitable signal for demodulating data from a received radio frequency signal using, for example, a demodulator.

Figure 3:
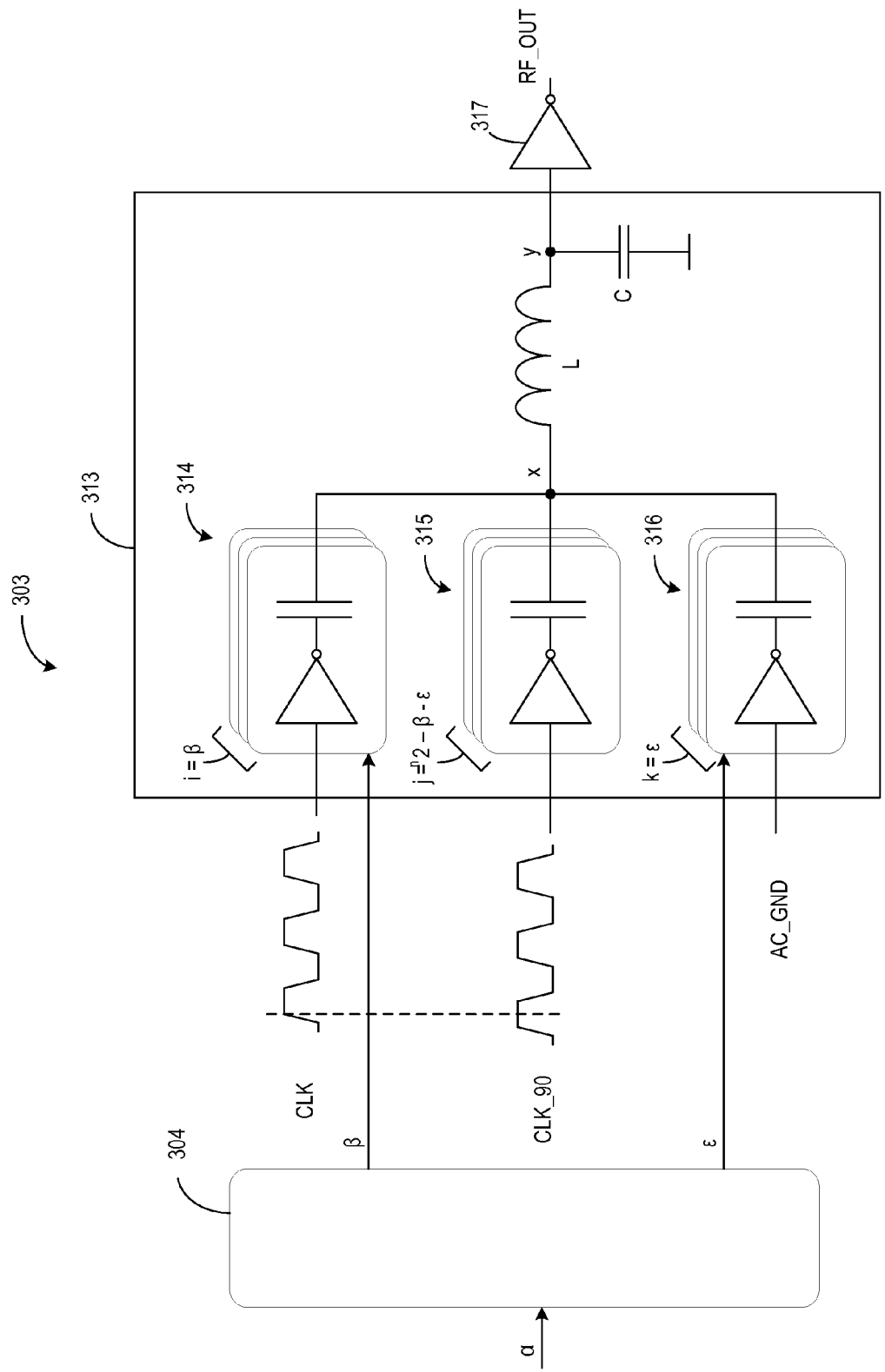
FIG. 3 illustrates a DTC for resolving issues associated with PVT variations and thermal and flicker noise in accordance with some examples.

FIG. 3 illustrates an example DTC 303 solution for resolving issues associated with PVT variations and thermal and flicker noise. The solution includes a capacitive phase interpolator 313. In an example, the capacitive phase interpolator 313 can receive a first clock signal (CLK) and a second clock signal (CLK_90). The second clock signal (CLK_90) can be a 90 degree shifted representation of the first clock signal (CLK). The first and second clock signals (CLK, CLK_90) can be interpolated by a set of capacitor networks (314, 315, 316) that are responsive to phase modulation information ($\beta$, $\epsilon$) received at the capacitive phase interpolator 313. In certain examples, the phase modulation information ($\beta$, $\epsilon$) can be received from a baseband processor or digital signal processor. In some examples, the phase interpolation information ($\beta$, $\epsilon$) is received from a conversion circuit that converts input codes ($\alpha$) to phase modulation information ($\beta$, $\epsilon$) formatted for the capacitive phase interpolator 313. In some examples, the conversion circuit can include a pre-distortion circuit 304 for pre-distorting the phase interpolation information ($\beta$, $\epsilon$) to compensate for nonlinearities of the capacitive phase interpolator 313.

The phase modulation information ($\beta$, $\epsilon$) can control the amount (i, j, k) of unit capacitors connected to each of the first clock signal (CLK), second clock signal (CLK_90), and ground (AC_GND). A sinusoidal-type phase modulated signal, or signal information, can be constructed from the output of the capacitor networks using a inductor-capacitor (LC) filter tuned for the fundamental frequency of the modulated signal. In certain examples, a buffer 317, such as a CMOS buffer, can receive the sinusoidal-type signal and can provide a digital phase modulated signal. In certain examples, the LC filter needs to provide a steep roll-off to achieve linear output phase shift over the range of input codes ($\alpha$) of the phase modulation information ($\beta$, $\epsilon$). For example, a harmonic at three times the fundamental frequency can pose particular issues if not attenuated. In certain examples, the DTC 303 can be implemented as a component of a system on a chip (SOC).

FIGS. 4A, 4B and 4C illustrate performance characteristics associated with the DTC structure (e.g., DTC 303) illustrated in FIG. 3. FIG. 4A illustrates a sinusoidal-type signal that can be generated a certain nodes in the DTC upon the reception of two orthogonal phases signals. FIG. 4A includes a first signal 401 measured at node x of FIG. 3 and a second signal 402 indicative of voltage at node y of FIG. 3. FIGS. 4B and 4C are frequency domain plots of the magnitude (FIG. 4B) and phase (FIG. 4C) of the first signal 401. The fundamental frequency of the first signal 401 is normalized in each plot of FIGS. 4B and 4C. Due to the use of two orthogonal phases for discretization of the waveform, the sine-wave is sampled at about 4 times the fundamental frequency. Such sampling can generate aliased tones at three times the fundamental frequency. In certain examples, the nearby alias tone can also bring opposite phase information (see, e.g., FIG. 4C) compared to the fundamental frequency phase information. In some examples, suppression of the nearby alias tone may be needed to preserve linearity of the DTC. A selective LC filter can be used to provide the very steep roll-off capable of providing the needed suppression. In certain examples, a notch filter can also be used. In either case, a fine tuning of the LC network is needed that will depend on the LO frequency. For the above reasons, it is apparent that the use of a DTC as illustrated in FIG. 2 can be limited by the LC filter. Therefore, even though the architecture illustrated in FIG. 2 can resolve PVT variances and thermal and flicker noise issues, the architecture also imposes some limitations. For example, since the LC filter is tuned to the fundamental frequency desired, the architecture cannot be directly replicated for other frequency bands in most cases. Also, the architecture introduces a coil for each DTC in the system which consumes additional circuit area and can be prone to magnetic coupling with other circuits such as the PLL and the supply circuits.

Figure 5:
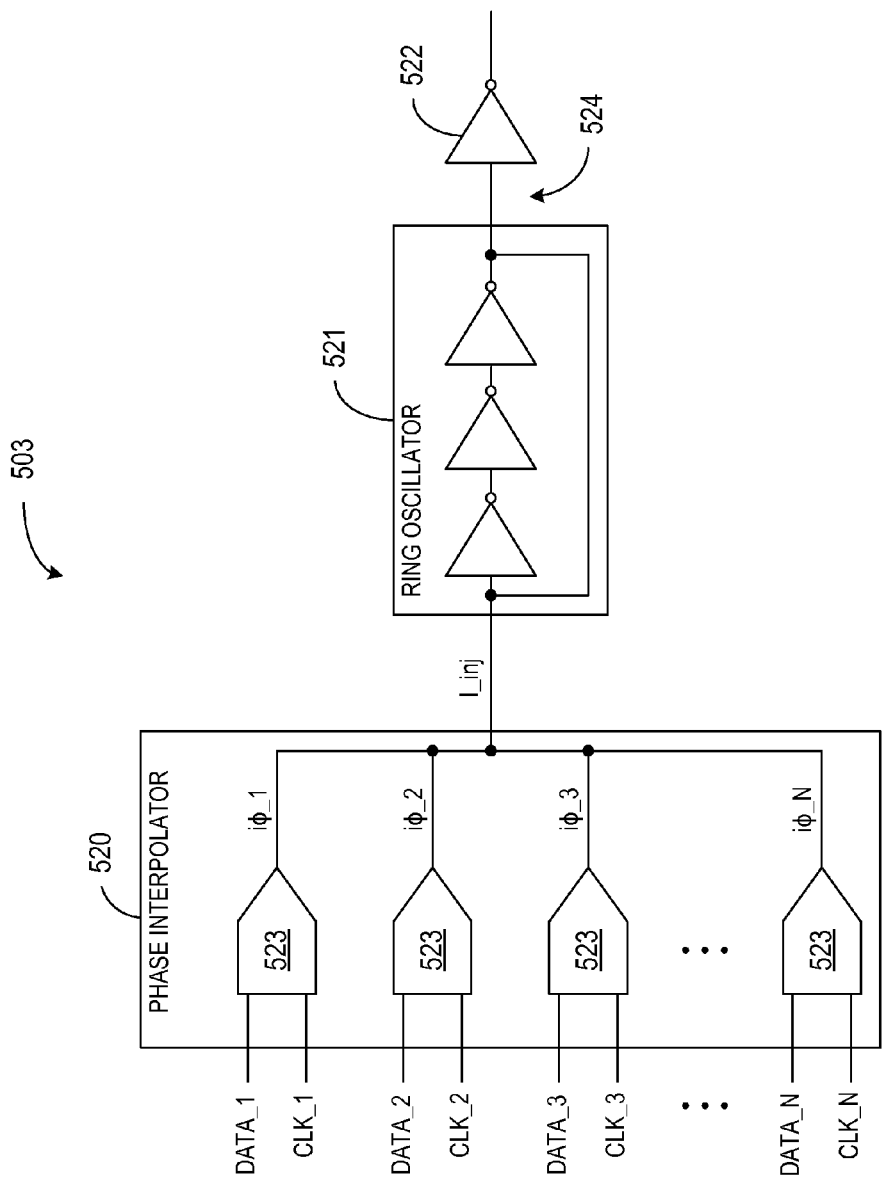
FIG. 5 illustrates generally an example DTC according to the present subject matter.

FIG. 5 illustrates generally an example DTC 503 according to the present subject matter that is configured to alleviate issues associated with PVT variations, thermal noise, flicker noise and close fundamental frequency harmonics while maintaining a fully digital structure. In certain examples, the DTC 503 can employ three or more phase signals to relax the need for a selective filter. In certain examples, the DTC 503 can include an n-phase interpolator 520 (n≥2) and a ring oscillator 521. In some examples, the DTC 503 can include an output buffer 522. In an example, the phase interpolator 520 can include n digital-to-analog converters (DACs), such as capacitive or current DACs 523. The DACs 523 can be clocked using the n phase signals (CLK_1, . . . , CLK_N). In some examples, each of the n phase signals (CLK_1, . . . , CLK_N) can have substantially the same fundamental frequency as the other phase signals, but each phase signal is phased differently than each other phase signal. In some examples, the DTC 503 can include one or more frequency dividers to receive reference frequency information and provide the offset phase signals (CLK_1, . . . , CLK_N) or signal information. In some examples, a reference generator can include the frequency dividers and can provide the n phase signals to the DTC 503. In addition to receiving a phase signal, each DAC 523 can receive phase modulation information, or coefficients, (DATA_1, . . . , DATA_N) for processing the corresponding clock signal (CLK_1, . . . , CLK_N). Upon processing the received phase signals in accordance with the phase modulation information, the outputs of the DACs 523 can be summed, or mixed, to provide an interpolated signal having a phase interpolated from the combination of n phase signals (CLK_1, . . . , CLK_N) and the corresponding phase modulation information (DATA_1, . . . , DATA_N).

In an example, the DTC 503 can include a summer or summer node and the output charges or currents (iφ_1, . . . , iφ_N) of the n capacitive or current DACs 523 can be summed together to generate an injection signal (I_inj) whose phase is the interpolation of the n phase signals. In some examples, the DTC 503 can include a single DAC that can convert the n digital representation of distinct phase samples (CLK_1, . . . , CLK_N) and interpolate the converted analog signals using the coefficients (DATA_1, . . . , DATA_N). The phase of the summed output charge or current can be varied by adjusting the coefficients or phase modulation information (DATA_1, . . . , DATA_N) provided to each of the capacitive or current DACs 523.

For the general case of interpolating two distinct phase signals, DTC 503 can provide an alternative solution that in some applications can be more flexible in alleviating PVT variances and thermal and flicker noise issues. In addition to alleviating PVT variances and thermal and flicker noise issues, DTC 503, when interpolating more than two distinct phase signals, can provide that nearby alias frequencies or nearby alias tones can be located a much higher frequencies thus reducing the potential for the alias tone to interfere with the performance of the system.

The summed output signal, such as the injection current signal (I_inj) of the current DACs 523, can be used as a locking signal for the ring oscillator 521. The ring oscillator 521 can lock to the fundamental frequency of the injection signal (I_inj) and can follow the changing phase of the injection signal. In a locked condition, noise within the generated clock signal at the output 524 of the ring oscillator is based on the noise within the injection signal (I_inj). In certain examples, the generated clock signal can span different frequencies within the locking range of the ring oscillator, thus enabling the use of the same digital DTC structure for different channel frequencies. In certain examples, the DTC can include a buffer 522 to allow the output signal to properly drive a load, such as the input of a radio-frequency (RF) DAC.

Figure 6B:
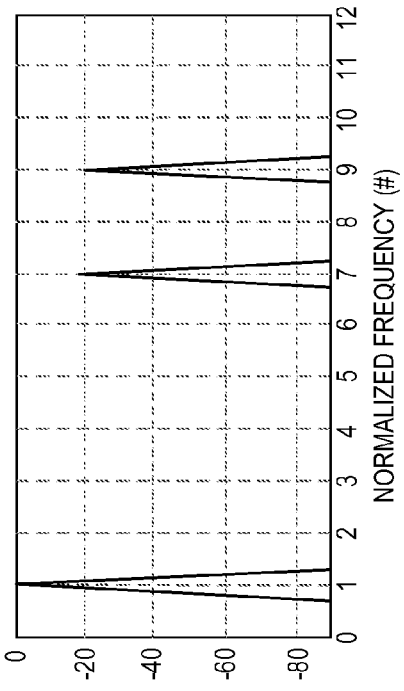
FIGS. 6A, 6B and 6C illustrate performance characteristics associated with the example DTC structure illustrated in FIG. 4.
Figure 6C:
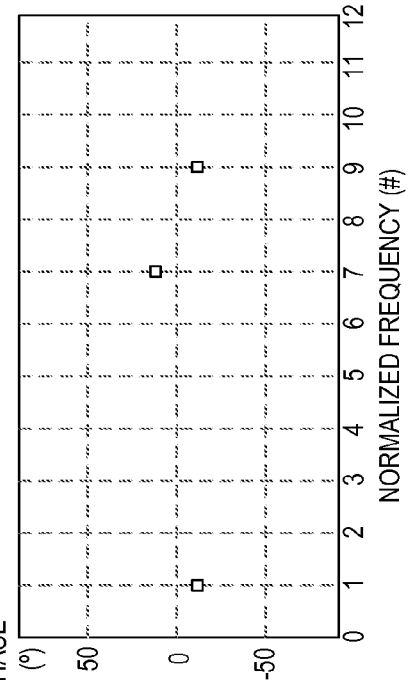
Figure 6A:
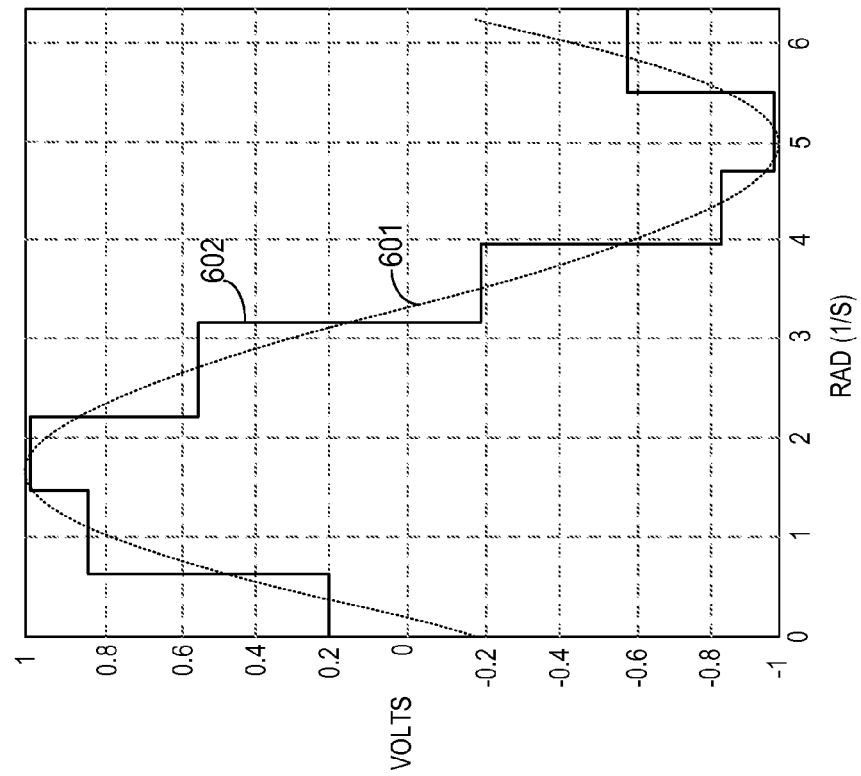

FIGS. 6A, 6B and 6C illustrate performance characteristics associated with the example DTC structure (e.g., DTC 503) illustrated in FIG. 5. FIG. 6A illustrates a sinusoidal-type signal 601 with a given phase that can be generated by interpolation 602 of four phase signals shifted by 45 degrees. FIGS. 6B and 6C are frequency domain plots of the magnitude (FIG. 6B) and phase (FIG. 6C) of the sinusoidal-type signal 601. The fundamental frequency of the sinusoidal-type signal 601 is normalized in each plot of FIGS. 6B and 6C. Note that the interpolation of more than two signals for the discretization of the waveform, the sine-wave in the illustrated example, is sampled at about 8 times the fundamental frequency. Such sampling can generate first aliased tones at much higher frequencies, for example at 7 times the fundamental frequency for the illustrated example. In an example where the fundamental frequency is 4 GHz, the first alias tone can be moved from 12 GHz, for the 2-phase solution, to 28 GHz for the 4-phase solution. The use of more than 2 phase signals to interpolate the injection signal of the ring oscillator relaxes the need to provide a selective filter.

Figure 7:
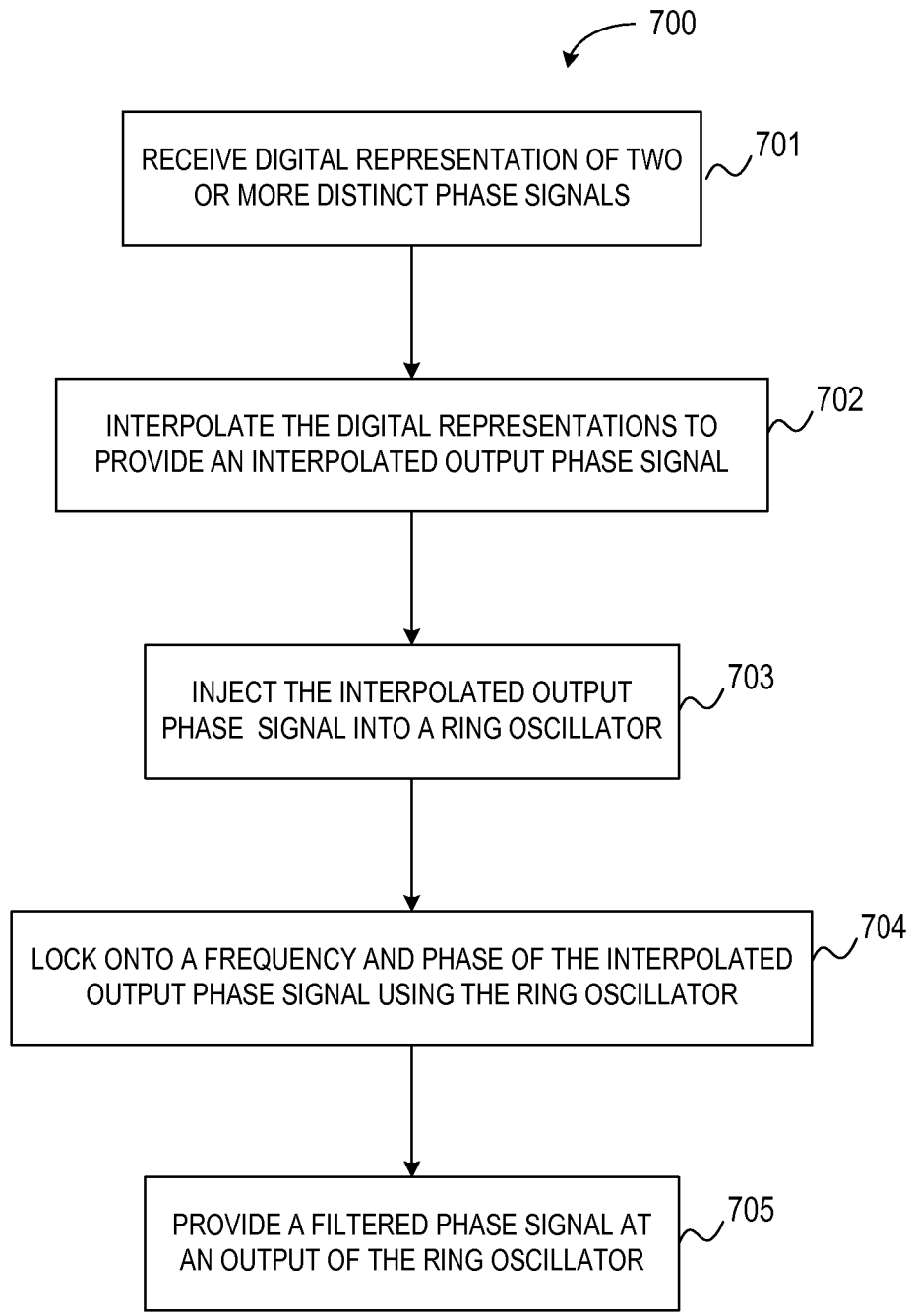
FIG. 7 illustrates generally an example method for interpolating a phase modulated signal according to the present subject matter.

FIG. 7 illustrates generally an example method 700 for interpolating a phase modulated signal according to the present subject matter. At operation 701, an interpolator can receive digital representation of at least three distinct phase signals. In certain examples, each of the at least three phase signals is offset in phase from each of the other phase signals. At operation 702, the at least three phase signals can be interpolated to provide an interpolated output phase signal. In an example, capacitive or current digital-to-analog converters can be used to generate charge or current signals representative of each of the phase signals, and the charge or current signals can be summed to provide the interpolated output signal. In some examples, one or more DACs can receive interpolation information for providing the interpolated output signal via one or more parameters or coefficients associated with each of the DACs. At operation 703, the interpolated output signal can be injected into a ring oscillator. At operation 704, the ring oscillator can lock on to the frequency and phase of the interpolated output signal to filter out spurious tomes or noise, such as, but not limited to, alias tones, PVT variations, thermal and flicker noise, etc. At operation 705, an output of the ring oscillator can provide a filtered phase signal that can be used for a variety of applications, including, but not limited to, wired and wireless communications.

EXAMPLES AND ADDITIONAL NOTES

In Example 1, a digital-to-time-converter (DTC) can include a phase interpolator configured to receive digital representations of two or more distinct phase signals, and to interpolate the digital representations of the two or more distinct phase signals to provide an interpolated output phase signal, and a ring oscillator configured to receive the interpolated output phase signal, to lock on to a frequency and a phase of the interpolated output phase signal and to provide a filtered phase signal.

In Example 2, the phase interpolator of Example 1 optionally is configured to receive a plurality of coefficients, and to interpolate the two or more distinct phase signals using the plurality of coefficients to provide the interpolated output phase signal.

In Example 3, the phase interpolator of any one or more of claims 1-2 optionally includes one or more digital to analog converters (DACs) configured to receive the digital representations of the two or more distinct phase signals, to receive the plurality of coefficients, and to provide the interpolated phase signal.

In Example 4, the phase interpolator of any one or more of claims 1-3 optionally includes two or more digital-to-analog converters (DACs), each DAC of the two or more DACs configured to receive a corresponding digital representation of one phase signal of the two or more distinct phase signals, to receive a coefficient of the plurality of coefficients, and to provide an analog representation of the one phase signal.

In Example 5, the phase interpolator of any one or more of claims 1-4 optionally includes a summer coupled to an output of each of the two or more DACs, the summer configured to sum the analog representation of the one phase signal of each of the two or more DACs and to provide the interpolated output phase signal.

In Example 6, the analog representation of the one phase signal of any one or more of claims 1-5 optionally includes a current signal.

In Example 7, the analog representation of the one phase signal of any one or more of claims 1-6 optionally is a charge signal.

In Example 8, the DTC of any one or more of claims 1-7 optionally includes a plurality of frequency dividers configured to receive reference frequency and phase information of a reference signal and to provide the digital representations of the two or more distinct phase signals using the reference frequency and phase information of the reference signal.

In Example 9, the DTC of any one or more of claims 1-8 optionally includes a phase lock loop configured to provide the reference frequency and phase information to each of the plurality of frequency dividers.

In Example 10, the phase interpolator of any one or more of claims 1-9 optionally is configured to receive digital representations three or more distinct phase signals, and to interpolate the digital representations of the three or more distinct phase signals to provide the interpolated output phase signal.

In Example 11, each of the digital representations of three distinct phase signals of any one or more of claims 1-10 optionally includes a common fundamental frequency.

In Example 12, a method of providing a filtered interpolated phase signal, the method can include receiving digital representations of two or more distinct phase signals at a phase interpolator for a digital-to-time converter (DTC), interpolating the digital representations of the two or more distinct phase signals to provide an interpolated output phase signal using the phase interpolator, injecting the interpolated output phase signal into a ring oscillator, locking onto a frequency and a phase of the interpolated output phase signal, and providing a filtered interpolated phase signal at an output of the ring oscillator.

In Example 13, the method of any one or more of claims 1-12 optionally includes receiving a plurality of coefficients at the phase interpolator, wherein interpolating the digital representations of the two or more distinct phase signals includes interpolating the digital representations of the two or more distinct phase signals using the plurality of coefficients to provide the interpolated output phase signal.

In Example 14, the receiving the digital representations of the two or more distinct phase signals at the phase interpolator of any one or more of claims 1-13 optionally includes receiving a digital representation of one phase signal of the two or more distinct phase signals at a first corresponding digital-to-analog converter (DAC) of the phase interpolator, wherein the first corresponding DAC is one of two or more DACs of the phase interpolator.

In Example 15, the receiving a plurality of coefficients at the phase interpolator of any one or more of claims 1-14 optionally includes receiving one coefficient of the plurality of coefficients at the first corresponding DAC.

In Example 16, the method of any one or more of claims 1-15 optionally includes providing an analog representation of the one phase signal using the first corresponding DAC and the one coefficient.

In Example 17, the method of any one or more of claims 1-16 optionally includes summing each output of the two or more DACs to provide the interpolated output phase signal.

In Example 18, the providing the analog representation of the one phase signal of any one or more of claims 1-17 optionally includes providing an analog current signal representative of the one phase signal.

In Example 19, the providing the analog representation of the one phase signal of any one or more of claims 1-17 optionally includes providing an analog charge signal representative of the one phase signal.

In Example 20, the method of any one or more of claims 1-19 optionally includes receiving reference frequency and phase information of a reference signal at a plurality of frequency dividers, and providing the digital representations of the three distinct phase signals using the plurality of frequency dividers and the reference frequency and phase information of the reference signal.

In Example 21, the method of any one or more of claims 1-20 optionally includes providing the reference frequency and phase information to each of the plurality of frequency dividers using a phase lock loop (PLL).

In Example 22, each of the digital representations of the three distinct phase signals of any one or more of claims 1-21 optionally includes a common fundamental frequency.

In Example 23, a transceiver can include a baseband processor configured to provide phase modulation information, a reference generator configured to provide two or more reference phase signals, each of the two or more reference phase signals having a phase offset from a phase of each of the other reference phase signals, and a digital-to-time converter. The digital-to-time converter can include a phase interpolator configured to receive the two or more reference phase signals and the phase modulation information, and to interpolate the two or more reference phase signals to provide an interpolated output phase signal, and a ring oscillator configured to receive the interpolated output phase signal, to lock on to a frequency and a phase of the interpolated output phase signal and to provide a filtered phase signal.

In Example 24, the transceiver of any one or more of claims 1-23 optionally includes an amplifier configured to receive the filtered phase signal and a corresponding amplitude signal and to provide a radio frequency signal.

In Example 25, the transceiver of any one or more of claims 1-24 optionally includes a demodulator configured to receive a radio frequency signal from an antenna and the filtered phase signal and to provide a data signal representative of data demodulated from the radio signal using the filtered phase signal.

In Example 26, the transceiver of any one or more of claims 1-2 optionally includes one or more antenna coupled to the amplifier.

Example 27 can include, or can optionally be combined with any portion or combination of any portions of any one or more of Examples 1 through 26 to include, subject matter that can include means for performing any one or more of the functions of Examples 1 through 26, or a machine-readable medium including instructions that, when performed by a machine, cause the machine to perform any one or more of the functions of Examples 1 through 26.

The above detailed description includes references to the accompanying drawings, which form a part of the detailed description. The drawings show, by way of illustration, specific embodiments in which the present subject matter can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the present subject matter should be determined with reference to the appended claims, along with the full scope of equivalents to which such claims are entitled.

What is claimed is:

1. A digital-to-time-converter (DTC) comprising:
   a phase interpolator configured to receive digital representations of two or more distinct phase signals, and to interpolate the digital representations of the two or more distinct phase signals to provide an interpolated output phase signal; and
   a ring oscillator configured to receive the interpolated output phase signal, to lock on to a frequency and a phase of the interpolated output phase signal and to provide a filtered phase signal having transitions separated in time in accordance with corresponding transitions of the digital representations of the two or more distinct phase signals;
   wherein the phase interpolator is configured to receive a plurality of coefficients, and to interpolate the two or more distinct phase signals using the plurality of coefficients to provide the interpolated output phase signal; and
   wherein the phase interpolator includes two or more digital-to-analog converters (DACs), each DAC of the two or more DACs is configured to receive a corresponding digital representation of one phase signal of the two or more distinct phase signals, to receive a coefficient of the plurality of coefficients, and to provide an analog representation of the one phase signal.

2. The DTC of claim 1, wherein the phase interpolator includes a summer coupled to an output of each of the two or more DACs, the summer configured to sum the analog representation of the one phase signal of each of the two or more DACs and to provide the interpolated output phase signal.

3. The DIC of claim 1, wherein the analog representation of the one phase signal is a current signal.

4. The DTC of claim 1, wherein the analog representation of the one phase signal is a charge signal.

5. The DTC of claim 1, including a plurality of frequency dividers configured to receive reference frequency and phase information of a reference signal and to provide the digital representations of the two or more distinct phase signals using the reference frequency and phase information of the reference signal.

6. The DTC of claim 5, including a phase lock loop configured to provide the reference frequency and phase information to each of the plurality of frequency dividers.

7. The DTC of claim 1, wherein the phase interpolator is configured to receive digital representations three or more distinct phase signals, and to interpolate the digital representations of the three or more distinct phase signals to provide the interpolated output phase signal.

8. The DTC of claim 1, wherein each of the digital representations of three distinct phase signals include a common fundamental frequency.

9. A method of providing a filtered interpolated phase signal, the method comprising:

receiving digital representations of two or more distinct phase signals at a phase interpolator for a digital-to-time converter (DTC);

receiving a plurality of coefficients at the phase interpolator;

interpolating the digital representations of the two or more distinct phase signals to provide an interpolated output phase signal using the phase interpolator;

injecting the interpolated output phase signal into a ring oscillator;

locking onto a frequency and a phase of the interpolated output phase signal;

providing a filtered interpolated phase signal at an output of the ring oscillator;

wherein interpolating the digital representations of the two or more distinct phase signals includes interpolating the digital representations of the two or more distinct phase signals using the plurality of coefficients to provide the interpolated output phase signal;

wherein receiving the digital representations of the two or more distinct phase signals at the phase interpolator includes receiving a digital representation of one phase signal of the two or more distinct phase signals at a first corresponding digital-to-analog converter (DAC) of the phase interpolator, wherein the first corresponding DAC is one of two or more DACs of the phase interpolator; and wherein receiving a plurality of coefficients at the phase interpolator includes receiving one coefficient of the plurality of coefficients at the first corresponding DAC.

10. The method of claim 9, including providing an analog representation of the one phase signal using the first corresponding DAC and the one coefficient.

11. The method of claim 10, including summing each output of the two or more DACs to provide the interpolated output phase signal.

12. The method of claim 10, wherein providing the analog representation of the one phase signal includes providing an analog current signal representative of the one phase signal.

13. The method of claim 10, wherein providing the analog representation of the one phase signal includes providing an analog charge signal representative of the one phase signal.

14. The method of claim 9, including receiving reference frequency and phase information of a reference signal at a plurality of frequency dividers; and providing the digital representations of the three distinct phase signals using the plurality of frequency dividers and the reference frequency and phase information of the reference signal.

15. The method of claim 14, including providing the reference frequency and phase information to each of the plurality of frequency dividers using a phase lock loop (PLL).

16. The method of claim 14, wherein each of the digital representations of the three distinct phase signals includes a common fundamental frequency.

17. A transceiver comprising:
a baseband processor configured to provide phase modulation information;
a reference generator configured to provide two or more reference phase signals, each of the two or more reference phase signals having a phase offset from a phase of each of the other reference phase signals; and
a digital-to-time converter, the digital to time converter comprising:
a phase interpolator configured to receive the two or more reference phase signals and the phase modulation information, and to interpolate the two or more reference phase signals to provide an interpolated output phase signal;
a ring oscillator configured to receive the interpolated output phase signal, to lock on to a frequency and a phase of the interpolated output phase signal and to provide a filtered phase signal;
wherein the phase interpolator is configured to receive a plurality of coefficients, and to interpolate the two or more distinct phase signals using the plurality of coefficients to provide the interpolated output phase signal; and
wherein the phase interpolator includes two or more digital-to-analog converters (DACs), each DAC of the two or more DACs is configured to receive a corresponding digital representation of one phase signal of the two or more distinct phase signals, to receive a coefficient of the plurality of coefficients, and to provide an analog representation of the one phase signal.

18. The transceiver of claim 17, further comprising an amplifier configured to receive the filtered phase signal and a corresponding amplitude signal and to provide a radio frequency signal.

19. The transceiver of claim 18, further comprising a demodulator configured to receive a radio frequency signal from an antenna and the filtered phase signal and to provide a data signal representative of data demodulated from the radio signal using the filtered phase signal.

20. The transceiver of claim 18, further comprising one or more antenna coupled to the amplifier.

* * * * *

UNITED STATES PATENT AND TRADEMARK OFFICE
CERTIFICATE OF CORRECTION

PATENT NO. : 9,819,356 B2
APPLICATION NO. : 14/570299
DATED : November 14, 2017
INVENTOR(S) : Ponton et al.

It is certified that error appears in the above-identified patent and that said Letters Patent is hereby corrected as shown below:

In the Claims

In Column 10, Line 45, in Claim 3, delete "DIC" and insert --DTC-- therefor

Signed and Sealed this
Fifth Day of May, 2020

Andrei Iancu
*Director of the United States Patent and Trademark Office*